United States Patent [19]

Thomas

[11] Patent Number: 5,519,335
[45] Date of Patent: May 21, 1996

[54] ELECTRONIC TESTER FOR TESTING $I_{DDQ}$ IN AN INTEGRATED CIRCUIT CHIP

[75] Inventor: Robert W. Thomas, Valley Center, Calif.

[73] Assignee: Unisys Corporation, Blue Bell, Pa.

[21] Appl. No.: 402,684

[22] Filed: Mar. 13, 1995

[51] Int. Cl.⁶ ............................ G01R 31/26; G01R 31/28
[52] U.S. Cl. ................................. 324/765; 324/763
[58] Field of Search ................................ 324/73.1, 158.1, 324/537, 500, 763, 765; 371/22.5

[56] References Cited

U.S. PATENT DOCUMENTS

| | | | |
|---|---|---|---|
| 5,332,973 | 7/1994 | Brown et al. | 324/537 |
| 5,371,457 | 12/1994 | Lipp | 324/73.1 |
| 5,392,293 | 2/1995 | Hsue | 324/158.1 |

*Primary Examiner*—Ernest F. Karlsen
*Assistant Examiner*—Russell M. Kobert
*Attorney, Agent, or Firm*—Charles J. Fassbender; Mark T. Starr; Robert R. Axenfeld

[57] ABSTRACT

An electronic tester, for testing $I_{ddq}$ in an integrated circuit chip, comprises: 1) a first power supply, having a large current capacity, which sends current to the chip through a first diode; 2) a second power supply, having a current sensor and a small current capacity which is substantially less than the large current capacity, which sends current to the chip through a second diode which is in parallel with the first diode; and 3) a control module which sends test vectors to the chip during a series of spaced apart $T_A$ time intervals, and sends control signals to at least one of the power supplies which indicate when the $T_A$ time intervals occur. In response to the control signals, the one power supply generates a first output voltage during the $T_A$ time intervals which forward biases said first diode and reverse biases said second diode; and it also generates a second output voltage between the $T_A$ time intervals which forward biases the second diode and reverse biases the first diode so long as the small current capacity is not exceeded.

16 Claims, 4 Drawing Sheets

ELECTRONIC TESTER FOR TESTING $I_{DDQ}$ IN AN INTEGRATED CIRCUIT CHIP

BACKGROUND OF THE INVENTION

This invention relates to electronic testers for integrated circuit chips; and more particularly, it relates to electronic testers which send multiple test vectors to a chip and determine whether any such test vector causes a current $I_{ddq}$ to flow through the chip above a predetermined test limit.

Many present-day integrated circuit chips contain over 1 million transistors. And, when a chip is made, any one of the transistors on the chip can contain a defect. Thus, each integrated circuit chip is usually tested by an electronic tester before the chip is permanently soldered into another type of assembly, such as a multi-chip module.

In the prior art, one test which is made in order to find a defective transistor on an integrated circuit chip is called an $I_{ddq}$ test. This test is performed, for example, by an electronic tester called the Schlumberger ITS 9000, which costs about five million dollars.

To perform the $I_{ddq}$ test in the prior art, a chip is connected through a first electromechanical relay to a large power supply which has a large current capacity. Then, a test vector is sent to the chip. Thereafter, the chip is connected through a second electromechanical relay to a small power supply which has a small current capacity, and the first relay to the large power supply is opened. Then, the current $I_{ddq}$ to the chip from the small power supply is measured with a high degree of accuracy.

If the current $I_{ddq}$ is less than a predetermined test limit, the large power supply is again connected to the chip via the first relay and the small power supply is disconnected from the chip via the second relay. Then another test vector is sent to the chip, and the sequence continues as described above. On the other hand, if the measured current $I_{ddq}$ exceeds the predetermined test limit, then the test is terminated, and the chip is identified as being defective.

One problem, however, with the above-described test, it that it can actually cause a chip to fail when the chip itself does not otherwise contain any defective transistors. This can occur as follows.

Ideally, each test vector which is sent to the chip should contain no errors. However, in order to test all of the transistors on an entire chip, about three million test vectors usually need to be sent to the chip. Consequently, when the test vectors are initially generated, some of them may contain an error.

When an erroneous test vector is sent to the chip, it can cause a power bus in the chip to be shorted through various transistors in the chip to ground. If that occurs, the current capacity of the small power supply will be exceeded; and as a result, the voltage from the small power supply will drop towards to ground. At the same time, however, the erroneous test vector with its full voltage levels will continue to be applied by the tester to the chip. Consequently, some transistors on the chip will receive input voltages from the test vector which exceed the chip's power bus voltage; and that can destroy the transistor's operating characteristics.

Also, as the voltage from the small power supply drops towards ground, the set/reset state of any flip-flops on the chip will dissipate. Consequently, even if no transistors on the chip are destroyed by the erroneous test vector, the test cannot proceed by sending the next sequential test vector to the chip. That is because the output signals which come from the chip depend upon both the test vector which the chip receives and the set/reset states of the chip's internal flip-flops.

Accordingly, a primary object of the present invention is to provide a tester for integrated circuit chips in which the above drawbacks are overcome.

BRIEF SUMMARY OF THE INVENTION

In accordance with the present invention, one preferred embodiment of an electronic tester for testing $I_{ddq}$ in an integrated circuit chip has the following structure: 1) a large power supply is provided which has a large current capacity, and it sends current to the chip through a first diode; 2) a small power supply is provided which has a small current capacity and a current sensor, and it sends current to the chip through a second diode which is in parallel with the first diode; and 3) a control module is provided which sends test vectors to the chip during a series of spaced apart $T_A$ time intervals, and it also sends control signals to the small power supply which indicate when the $T_A$ time intervals occur.

In response to the control signals, the small power supply generates a first output voltage during the $T_A$ time intervals which forward biases the first diode and reverse biases the second diode. Also, in the time intervals $T_B$ which separate the $T_A$ time intervals, the small power supply generates a second output voltage which forward biases the second diode and reverse biases the first diode so long as the small current capacity of the small power supply is not exceeded.

When the first diode is forward biased and the second diode is reverse biased, all power to the chip comes from the large power supply. Conversely, when the first diode is reverse biased and the second diode is forward biased, all power to the chip comes from the small power supply.

Suppose now that an erroneous test vector is sent to the chip during one particular time interval $T_{Ai}$ which causes certain transistors on the chip to short the chip's internal power bus to ground. Then, during the following time interval $T_{Bi}$, the current capacity of the small power supply will be exceeded. Thus, the output voltage from the small power supply will drop until it becomes equal to the output voltage from the large power supply. When that occurs, both the first and second diodes will be forward biased; and so the large power supply with its large current capacity will maintain a proper supply voltage on the chip. Consequently, no transistors on the chip will be improperly biased and destroyed, and no flip-flops on the chip will lose their set/rest state.

DETAILED DESCRIPTION

Figure 1:
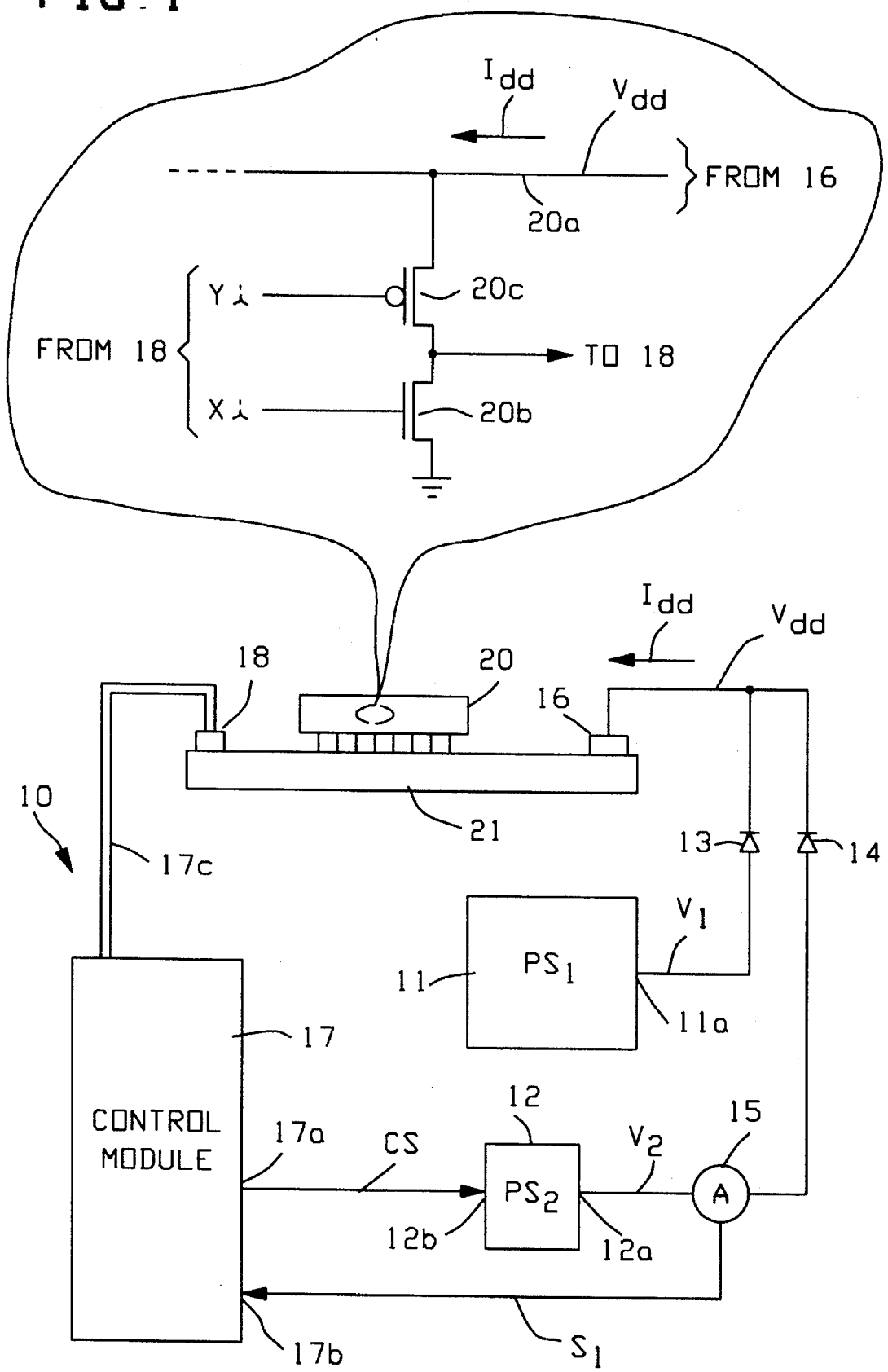
FIG. 1 is a block diagram of a tester which constitutes one preferred embodiment of the invention.

Referring now to FIG. 1, the details of an electronic tester 10, which constitutes one preferred embodiment of the invention, will be described. This electronic tester 10 includes all of the items 11–18 as they are interconnected in FIG. 1.

Note that FIG. 1 also shows two additional items 20 and 21 which operate with the tester 10 but are not part of the tester 10 per se. Item 20 is an integrated circuit chip which is being tested by the tester 10; and item 21 is a printed circuit board which intercouples the chip 20 to the tester 10.

Within the tester 10, item 11 is DC power supply which has an output terminal 11a on which a constant voltage $V_1$ of 6.3 volts is generated. This power supply 11 has a current capacity of 6 amps.

Item 12 is a DC power supply having an output terminal 12a on which a selectable voltage $V_2$ of either 5.6 volts or 7.0 volts is generated. To select one particular output voltage, the power supply 12 has in input terminal 12b on which a digital control signal CS is received. When the control signal CS is a "1", the voltage $V_2$ is 5.6 volts; whereas when the control signal CS is a "0", the voltage $V_2$ is 7.0 volts. This power supply 12 has a current capacity of 64 microamps, which is about 90,000 times smaller than the current capacity of the power supply 11.

Items 13 and 14 are a pair of diodes, and item 15 is a current sensor. Diode 13 couples the output terminal 11a of the power supply 11 to a connector 16. Diode 14, in series with the current sensor 15, couples with the output terminal 12a of the power supply 12 to the connector 16. From the connector 16, a voltage $V_{dd}$ and a current $I_{dd}$ are sent through the printed circuit board 21 to the integrated circuit chip 20.

Item 17 is a control module, which preferably includes a programmable digital computer. This control module 17 has an output terminal 17a, an input terminal 17b, and an input/output bus 17c with a connector 18.

From terminal 17a, the control signal CS is generated and sent to the power supply 12. On terminal 17b, a signal $S_1$ is received from the current sensor 15 which indicates the magnitude of the current which passes through the current sensor from the power supply 12. Over the input/output bus 17c, test vectors are sent to the chip 20; and in response to those test vectors, output signals from the chip 20 are sent over the input/output bus 17c to the control module 17.

Figure 2:
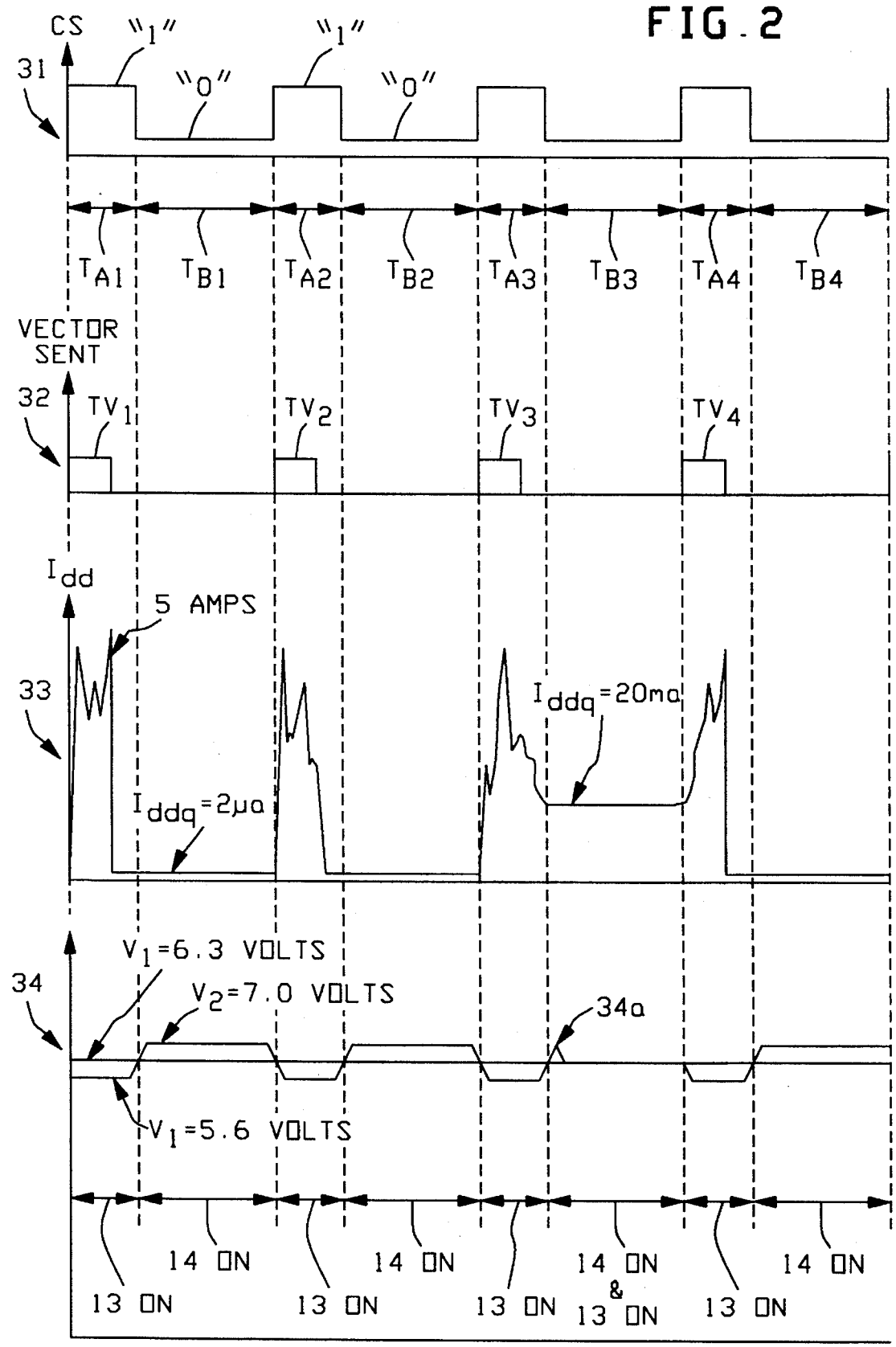
FIG. 2 is a set of waveforms which illustrate the operation of the FIG. 1 tester.

How all of the above-described items 11–18 function within the electronic tester 10 in accordance with the present invention is illustrated by a set of signal waveforms 31–34 as shown in FIG. 2. There, waveform 31 shows that the control signal CS is generated by the control module 17 as a series of pulses. The "1" level of those pulses defines a series of spaced apart time intervals $T_{A1}$, $T_{A2}$, $T_{A3}$, etc.; and the "0" level defines a series of $T_B$ time intervals which separate the $T_A$ time intervals.

During each of the $T_A$ time intervals, the control module 17 sends a respective test vector $TV_i$ over the input/output bus 17c to the integrated circuit chip 20. This is illustrated in FIG. 2 by the signal waveform 32. There, the test vector $TV_1$ is sent during the time interval $T_{A1}$; the test vector $TV_2$ is sent during the time interval $T_{A2}$; etc.

Each test vector which is sent to the integrated circuit chip 20 immediately causes various transistors within the chip to turn-on and/or turn-off. In other words, each test vector causes the integrated circuit chip 20 to change from one internal state to another state. Consequently, the current $I_{dd}$ which passes through the connector 16 to all of the circuitry on the chip 20 will have a large fluctuating magnitude until the state change is complete. This is illustrated in FIG. 2 by the signal waveform 33 wherein during each of the $T_A$ time intervals, the current $I_{dd}$ fluctuates and reaches magnitudes of up to 5 amps.

After a test vector is received and the corresponding state change within the integrated circuit chip 20 is completed, a quiescent $I_{dd}$ current (which is herein notated as $I_{ddq}$) passes through the chip 20. Normally, the current $I_{ddq}$ will have a very small magnitude such as 2 microamps. This occurs in the signal waveform 33 during the time intervals $T_{B1}$, $T_{B2}$, and $T_{B4}$.

However, if the integrated circuit chip 20 contains a defective transistor, that defect can cause the current $I_{ddq}$ to exceed a predetermined test limit, such as 10 microamps, during one of the $T_B$ time intervals. Likewise, if an erroneous test vector is sent to the integrated circuit chip 20, that test vector can also cause the current $I_{ddq}$ to exceed the test limit during one of the $T_B$ time intervals. In FIG. 2, such defects are illustrated as being detected during the time interval $T_{B3}$ because there, the current $I_{ddq}$ is 30 milliamps.

How a defective transistor on the chip 20 typically causes the current $I_{ddq}$ to exceed the test limit during a $T_B$ time interval can be understood by referring back to FIG. 1 and considering items 20a–20c. Item 20a is a power bus on the integrated circuit chip 20. This bus receives the voltage $V_{dd}$ and current $I_{dd}$ from the connector 16; and it distributes the voltage $V_{dd}$ and current $I_{dd}$ to all of the transistors which are on the chip.

In FIG. 1, items 20b and 20c are two transistors which form an inverter circuit on the chip 20. Transistor 20b has a gate which receives a digital signal $X_i$ in the test vector $TV_i$; and transistor 20c has a gate which receives a digital signal $Y_i$ in the test vector $TV_i$. Thus, the transistors 20b and 20c can be selectively turned-on and turned-off by the test vector.

If the test vector is selected to turn-on transistor 20b and turn-off transistor 20c, the current $I_{dd}$ will normally be less than 10 microamps. However, if transistor 20b turns-on due to a defect while transistor 20c is on due to the test vector, then the current $I_{ddq}$ will exceed 10 microamps.

Likewise, if one test vector is selected to turn-off transistor 20b and turn-on transistor 20c, then the current $I_{ddq}$ will normally be less than 10 microamps. However, if transistor 20c turns-on due to a defect while transistor 20b is on due to the test vector, then the current $I_{ddq}$ will exceed 10 microamps.

Also, suppose a test vector is erroneously selected such that it simultaneously turns-on both of the transistors 20b and 20c. In that case, the current $I_{ddq}$ will again exceed 10 microamps.

From the above description, it should be clear that during each of the $T_A$ time intervals, a large fluctuating $I_{dd}$ current of up to 5 amps needs to be supplied to the integrated circuit chip 20; whereas during each of the $T_B$ time intervals, a much smaller $I_{ddq}$ current needs to be supplied to the chip 20. Also, during the $T_B$ time intervals, the $I_{ddq}$ current which is being supplied to the chip 20 must be accurately measured in order to distinguish a defective chip from a non-defective chip. For example, if the test limit is 10 microamps, the current $I_{ddq}$ must be measured with an accuracy of at least 1 microamp.

How the above requirements are achieved with the present invention is illustrated in FIG. 2 by the signal waveform 34. There, during time interval $T_{A1}$, the power supply 12 responds to the control signal CS=1 by generating an output voltage $V_2$ of 5.6 volts. At the same time, the power supply 11 generates its fixed output voltage $V_1$ of 6.3 volts. Since the voltage $V_1$ is greater than the voltage $V_2$, the diode 13 becomes forward biased while the diode 14 becomes reversed biased. Consequently, during the time interval $T_{A1}$, all of the $I_{dd}$ current is furnished by the power supply 11.

Conversely, during time interval $T_{B1}$, the power supply 12 responds to the control signal CS=0 by generating an output voltage $V_2$ of 7 volts. At the same time, the power supply 11 continues to generate its fixed output voltage at 6.3 volts. Since the voltage $V_1$ is smaller than the voltage $V_2$, the diode 14 becomes forward biased and the diode 13 becomes reverse biased. Consequently, during the time interval $T_{B1}$, all of the $I_{dd}$ current is furnished by the power supply 12.

Current from the power supply 12 passes through the current sensor 15 where it is measured with a high degree of accuracy. Typically, an amp meter has an accuracy of about 0.02 percent of its full scale reading. Power supply 12 has a current capacity of only 64 microamps; and thus, the current from the power supply 12 can be measured with a typical accuracy of 64 microamps times 0.02 percent, or about 13 nanoamps.

By comparison, suppose that the small power supply 12 was eliminated; and suppose that the current $I_{dd}$ was sent to the integrated chip 20 at all times from just the large power supply 11. In that case, the accuracy with which the current from the large power supply could be sensed with a typical amp meter would be about 6 amps times 0.02 percent, or 1.2 milliamps. However, an accuracy of 1.2 milliamps is too large to distinguish a fault-free chip (i.e., $I_{dd}$ less than 10 microamps) from a faulty chip (i.e., $I_{dd}$ greater than 10 microamps).

In the signal waveform 34 of FIG. 2, the voltages $V_1$ and $V_2$ which occur during the time intervals $T_{A1}$ and $T_{B1}$ are repeated during the next two time intervals $T_{A2}$ and $T_{B2}$. Thus during time interval $T_{A2}$, all of the current $I_{dd}$ to the chip 20 is furnished by the large power supply 11 because diode 13 is forward biased, while diode 14 is reversed biased. Then during time interval $T_{B2}$, all of the current $I_{dd}$ to the chip 20 is furnished by the small power supply 11 because diode 13 is reverse biased while diode 14 is forward biased. Since the current $I_{dd}$ during the time interval $T_{B2}$ is less than 10 microamps, no defective chip is detected during that time.

By comparison, during the next time intervals $T_{A3}$ and $T_{B3}$, a defective chip is detected. Inspection of the FIG. 2 waveform 34 shows that in time interval $T_{A3}$, the voltage $V_1$ is larger than voltage $V_2$; and thus all of the current $I_{dd}$ is furnished by the large power supply 11. Then, at the start of time interval $T_{B3}$, the small power supply 12 responds to the control signal CS by attempting to raise its output voltage $V_2$ from 5.6 volts to 7.0 volts. However, power supply 12 has a current capacity of only 64 microamps, whereas the chip 20 is passing a total of 30 milliamps due to a defective transistor. When the power supply 12 attempts to furnish more current than its current capacity, the output voltage $V_2$ starts to drop in magnitude as is indicated by reference numeral 34a on the signal waveform 34.

At the point where the output voltage $V_2$ from the power supply 12 drops to a level where it equals the output voltage $V_1$ from the power supply 11, the diodes 13 and 14 both turn on. As a result, the power supply 12 furnishes 64 microamps of the current $I_{dd}$ to the chip 20, and power supply 11 furnishes the remainder of the 30 milliamp current $I_{dd}$ to the chip 20. All of the current from power supply 12 passes through the current sensor 15; so during time interval $T_{B3}$, the 64 microamps from the power supply 12 indicates the presence of a defective chip.

Thereafter, during each of the next time intervals $T_{Ai}$ and $T_{Bi}$, either the waveforms of the two time intervals $T_{A1}$ and $T_{B1}$ are repeated, or the waveform of the two time intervals $T_{A3}$ and $T_{B3}$ are repeated. Each repetition of the $T_{A3}$ $T_{B3}$ waveforms indicate the presence of a defective chip and/or a faulty test vector.

One feature of the present invention is that throughout the testing of the chip 20, the transistors on the chip are never subjected to any abnormal voltages which can destroy the chip. In particular, the magnitude of the supply voltage $V_{dd}$ never drops below the magnitude of the input voltages from the test vectors. By comparison, if the input voltage to the gate of a transistor is kept at five volts while the supply voltage $V_{dd}$ is dropped from five volts to zero volts, the transistor operating characteristics can be destroyed.

Another feature of the present invention is that when a defective transistor on the chip 20 is detected, the test sequence need not stop at that point. Instead, all test vectors can be sent to the chip 20 in a sequence without interruption. This feature is seen from waveform 34 of FIG. 2 wherein during time intervals $T_{A3}$ and $T_{B3}$, a defective chip is detected; and thereafter during time intervals $T_{A4}$ and $T_{B4}$, the testing sequence continues with another test vector.

Still another feature of the above-described electronic tester 10 is that it employs no electromechanical relays to connect and disconnect the power supplies to the chip 20. This feature is important because electromechanical relays include a part which physically moves from one position to another in order to open or close the relay; and that movement inherently takes several milliseconds to complete. Typically, the number of test vectors which are needed to fully test all of the transistors on an entire chip is about 3 million. Thus, with the present invention, the total time that it takes to test a chip is substantially reduced because the switching time of an electromechanical relay, multiplied by a factor of about 3 million times two, is eliminated.

A preferred embodiment of the invention has now been described in detail. In addition, however, many changes and modifications can be made to this embodiment without departing from the nature and spirit of the invention. One such modification is shown in FIGS. 3 and 4.

Figure 3:
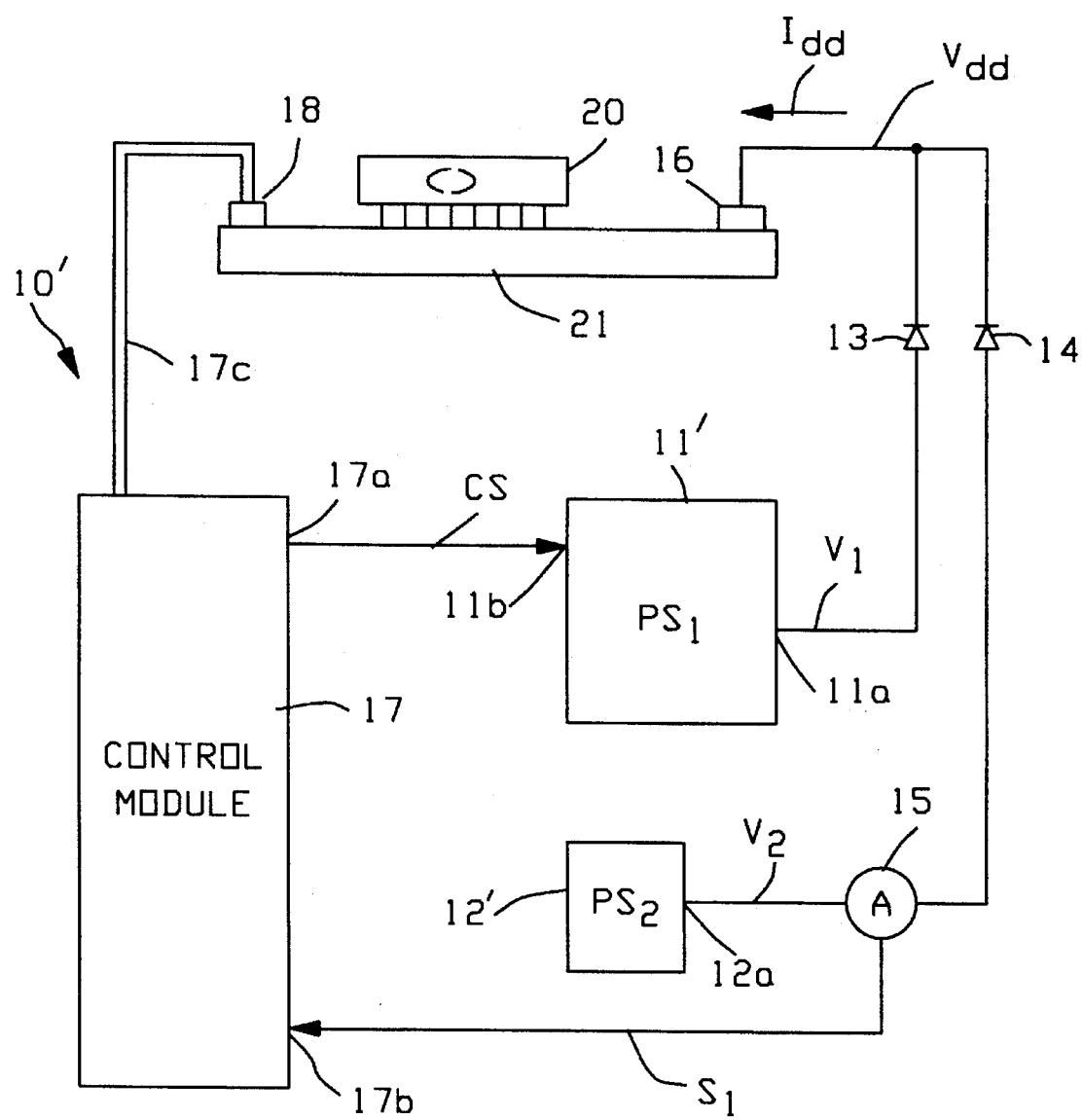
FIG. 3 is a block diagram of another tester which constitutes a second preferred embodiment of the present invention.
Figure 4:
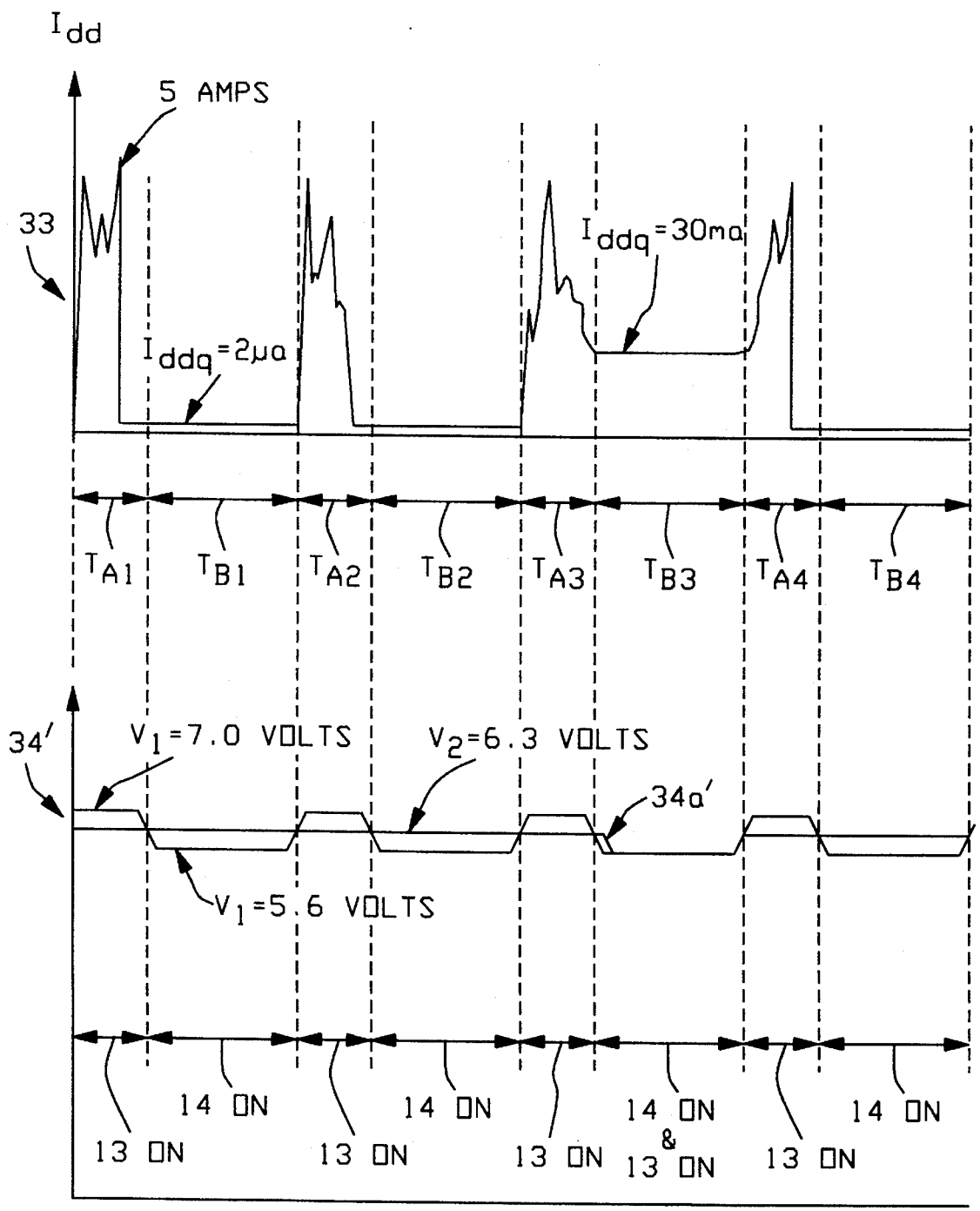
FIG. 4 is a set of waveforms which illustrate the operation of the FIG. 3 tester.

In FIG. 3, an electronic tester 10' is shown which is a modification of the electronic tester 10 of FIG. 1. Each component in the FIG. 3 tester 10' which is identical to a corresponding component in the FIG. 1 tester 10, is identified by the same reference numeral. For example, the diodes 13 and 14 in the tester 10' are the same as the diodes 13 and 14 in the tester 10.

On the other hand, each component in the FIG. 3 tester 10' which is a modification of the corresponding component in the FIG. 1 tester 10, is identified by the same reference numeral with an appended prime. These modified components consist of two power supplies 11' and 12'.

Power supply 11' is modified such that the voltage $V_1$ on output terminal 11a' is generated to selectively be either 5.6 volts or 7.0 volts. To select one particular output voltage, the power supply 11' has an input terminal 11b' on which the digital control signal CS is received. When the control signal CS is a "1", the voltage $V_1$ is 7.0 volts; whereas when the control signal CS is a "0", the voltage $V_1$ is 5.6 volts. This power supply 11' has a large current capacity of 6 amps.

Power supply 12' is modified such that it generates a constant voltage $V_2$ on its output terminal 12a' of 6.3 volts. This power supply 12' has a current capacity of only 64 microamps.

In operation, the FIG. 3 electronic tester 10' generates the previously described signal waveforms 31, 32, and 33 as they are shown in FIG. 2. To avoid duplication, only one of those waveforms (i.e. waveform 33) is repeated in FIG. 4. Then, shown below waveform 33 in FIG. 4 is another waveform 34' which illustrates how the voltages $V_1$ and $V_2$ are generated from the power supplies 11' and 12' respectively, during the $T_A$ and $T_B$ time intervals.

In time interval $T_{A1}$ of FIG. 4, power supply 11' responds to the control signal CS=1 by generating an output voltage $V_1$ of 7.0 volts. At the same time, power supply 12' generates its fixed output voltage $V_2$ of 6.3 volts. Since the voltage $V_1$ is greater than the voltage $V_2$, diode 13 becomes forward biased while diode 14 becomes reversed biased. Consequently, during the time interval $T_{A1}$, all of the $I_{dd}$ current is furnished by power supply 11'.

Conversely, in time interval $T_{B1}$ of FIG. 4, power supply 11' responds to the control signal CS=0 by generating an output voltage $V_1$ of 5.6 volts. At the same time, power supply 12' continues to generate its fixed output voltage at 6.3 volts. Since the voltage $V_1$ is smaller than the voltage $V_2$, diode 14 becomes forward biased while diode 13 becomes reverse biased. Consequently, during the time interval $T_{B1}$, all of the $I_{dd}$ current is furnished by power supply 12'.

In waveform 34' of FIG. 4, the voltages $V_1$ and $V_2$ which occur during the time intervals $T_{A1}$ and $T_{B1}$ are repeated during the next two time intervals $T_{A2}$ and $T_{B2}$. Thus during time interval $T_{A2}$, all of the current $I_{dd}$ is furnished by the large power supply 11' because diode 13 is forward biased and diode 14 is reversed biased. Then during time interval $T_{B2}$, all of the current $I_{dd}$ is furnished by the small power supply 11 because diode 13 is reverse biased and diode 14 is forward biased.

Since the current $I_{dd}$ during each of the time intervals $T_{B1}$ and $T_{B2}$ is less than 10 microamps, no defect in chip 20 is detected at those times. However, during the subsequent time interval $T_{B3}$, a defect is detected.

Inspection of the FIG. 4 waveform 34' shows that in time interval $T_{A3}$, the voltage $V_1$ is larger than voltage $V_2$; and thus all of the current $I_{dd}$ is furnished by the power supply 11'. Then, at the start of time interval $T_{B3}$, power supply 11' responds to the control signal CS=0 by dropping its output voltage $V_1$ from 7.0 volts to 5.6 volts.

When the voltage $V_2$ exceeds the voltage $V_1$ at the start of time interval $T_{B3}$, the small power supply 12' tries to furnish all of the current $I_{dd}$ to the chip 20. However, power supply 12' has a current capacity of only 64 microamps, whereas the chip 20 is passing a total of 30 milliamps due to a defective transistor. Thus as the power supply 12' attempts to furnish more current than its current capacity, the output voltage $V_2$ starts to drop in magnitude as is indicated by reference numeral 34a' on the signal waveform 34'.

At the point where the output voltage $V_2$ from power supply 12' drops to a level where it equals the output voltage of 5.6 volts from power supply 11', the diodes 13 and 14 are both on. As a result, power supply 12' furnishes 64 microamps of the current $I_{dd}$ to the chip 20; and power supply 11 furnishes the remainder of the 30 milliamp current $I_{dd}$ to the chip 20.

All of the current from power supply 12' passes through the current sensor 15. Consequently, during time interval $T_{B3}$, the 64 microamps from the power supply 12 indicates the presence of a defect on the chip 20.

As another modification, in both the tester 10 of FIG. 1 and the tester 10' of FIG. 3, the control signal CS can be generated as the inverse of the waveform 31 which is shown in FIG. 2. That is, the control signal CS can be a "0" during the $T_A$ intervals and be a "1" during the $T_B$ time intervals. With this modification, the power supply 12 in the tester 10 of FIG. 1 will generate an output voltage $V_1$ of 5.6 volts in response to the control signal CS=0, and it will generate an output voltage $V_1$ of 7.0 volts in response to the control signal CS=1. Likewise, with this modification, the power supply 11' in the tester 10' of FIG. 3 will generate an output voltage $V_1$ of 7.0 volts in response to a control signal CS=0, and it will generate an output voltage $V_1$ of 5.6 volts in response to the control signal CS=1.

Further, as still another modification, the output voltages $V_1$ and $V_2$ which are generated by the power supplies can be scaled up or down to provide whatever DC supply voltage the chip 20 requires. In the embodiment 10 of FIGS. 1 and 2, the DC supply voltage to the chip 20 is either 6.3 volts minus a forward voltage drop across diode 13, or 7.0 volts minus a forward voltage drop across diode 14. Typically, the forward voltage drop across a diode is about 0.8 volts; so the tester 10 of FIG. 1 is suitable for testing an integrated circuit chip 20 which will operate with a DC supply voltage of about 5.5 volts to 6.2 volts. However, if the chip 20 requires a DC supply voltage of 3.0 volts to 3.8 volts, then the voltages $V_1$ and $V_2$ from the power supplies 11 and 12 can be reduced in magnitude.

Further, as another modification, the electronic tester 10 of FIG. 1 may be changed such that the power supply 11 is replaced with the power supply 11' from the tester 10' of FIG. 3. With this modification, the control signal CS from the control module 17 is sent to both of the power supplies 11' and 12. As a result, the voltage $V_{dd}$ which is received by the chip 20 does not move from one level to another at the end of the $T_A$ and $T_B$ time intervals, unless the defective transistor is detected. For example, during time interval $T_{A1}$ in FIG. 2, the voltage $V_{dd}$ to the chip 20 will be 7 volts from power supply 11' minus the forward voltage drop across diode 13; and during time interval $T_{B1}$, the voltage $V_{dd}$ will be 7 volts from power supply 12 minus the forward voltage drop across diode 14.

Also, as yet another modification, the diodes 13 and 14 may be implemented several ways. For example, the diodes 13 and 14 can be PN junctions diodes. Alternatively, the diodes 13 and 14 can be Schottkey diodes. As another alternative, each of the diodes 13 and 14 can be implemented from a bipolar transistor in which the base of the transistor is connected to the collector.

Accordingly, since many modifications to the illustrated preferred embodiments may be made, it is to be understood that the present invention is not limited to the preferred embodiments, but is defined by the appended claims.

What is claimed is:

1. An electronic tester for testing $I_{ddq}$ in an integrated circuit chip; said electronic tester comprising:

a first power supply, having a large current capacity, which sends current to said chip through a first diode;

a second power supply, having a current sensor and a small current capacity that equals a test limit for $I_{ddq}$ which is substantially less than said large current capacity, which sends current to said chip through a second diode which is in parallel with said first diode;

a control module which sends test vectors to said chip during a series of spaced apart time intervals, and sends control signals to at least one of said power supplies with signal states that indicate when said time intervals occur; and, said one power supply being responsive to said states of said control signals to generate -1) a first output voltage during said time intervals which forward biases said first diode and reverse biases said second diode, and 2)

a second output voltage between said time intervals which forward biases said second diode and reverse biases said first diode so long as said small current capacity is not exceeded, and otherwise forward biases said first and second diodes which indicates excessive $I_{ddq}$ in said chip.

2. An electronic tester according to claim 1 wherein said one power supply is said second power supply.

3. An electronic tester according to claim 2 wherein said second output voltage is more than said first output voltage.

4. An electronic tester according to claim 3 wherein said second output voltage, minus a forward voltage drop across said second diode, is between 5.5 and 6.2 volts.

5. An electronic tester according to claim 3 wherein said second output voltage, minus a forward voltage drop across said second diode, is between 3.0 and 3.8 volts.

6. An electronic tester according to claim 1 wherein said one power supply is said first power supply.

7. An electronic tester according to claim 6 wherein said first output voltage is more than said second output voltage.

8. An electronic tester according to claim 7 wherein said first output voltage, minus a forward voltage drop across said first diode, is between 5.5 and 6.2 volts.

9. An electronic tester according to claim 7 wherein said first output voltage, minus a forward voltage drop across said first diode, is between 3.0 and 3.8 volts.

10. An electronic tester according to claim 1 wherein said control module sends said test vectors during said spaced apart time intervals in a fixed sequence regardless of whether or not said small current capacity is exceeded between any one of said time intervals.

11. An electronic tester according to claim 1 wherein said first diode and said second diode are PN junction diodes.

12. An electronic tester according to claim 1 wherein said first diode and said second diode are Schottky diodes.

13. An electronic tester according to claim 1 wherein said control signals have a "1" voltage level during said spaced apart time intervals, and a "0" voltage level between said time intervals.

14. An electronic tester according to claim 1 wherein said control signals have a "0" voltage level during said spaced apart time intervals, and a "1" voltage level between said time intervals.

15. An electronic tester according to claim 1 wherein said current sensor measures current from said second power supply with an accuracy of at least one microamp.

16. An electronic tester according to claim 1 wherein said large current capacity is at least one hundred times more than said small current capacity.

\* \* \* \* \*